(12) United States Patent
Krishnamoorthy et al.

(10) Patent No.: US 7,693,424 B1
(45) Date of Patent: *Apr. 6, 2010

(54) INTEGRATED PROXIMITY-TO-OPTICAL TRANSCEIVER CHIP

(75) Inventors: Ashok V. Krishnamoorthy, San Diego, CA (US); Danny Cohen, Pacific Palisades, CA (US); Robert J. Drost, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1315 days.

This patent is subject to a terminal disclaimer.

(21) Appl. No.: 11/165,917

(22) Filed: Jun. 24, 2005

Related U.S. Application Data

(63) Continuation-in-part of application No. 10/816,762, filed on Apr. 2, 2004, now Pat. No. 7,369,726.

(60) Provisional application No. 60/583,941, filed on Jun. 28, 2004.

(51) Int. Cl.
*H04B 10/00* (2006.01)

(52) U.S. Cl. .................. 398/135; 398/128; 398/118; 398/115; 398/130; 385/89; 385/90; 385/92; 385/93; 257/80; 257/84; 257/431; 257/48; 438/31; 438/107; 438/456; 438/63

(58) Field of Classification Search .............. 398/118, 398/115, 122, 124, 128, 130, 135, 136, 138, 398/139, 156, 79, 129, 131; 385/14, 24, 385/147, 89, 90, 92, 93; 257/80, 84, 431, 257/432, 48, 414; 438/31, 107, 456, 63, 438/64, 65
See application file for complete search history.

(56) References Cited

U.S. PATENT DOCUMENTS

| | | | |
|---|---|---|---|
| 5,198,684 A * | 3/1993 | Sudo ........................... 257/79 |
| 5,335,361 A * | 8/1994 | Ghaem ........................ 455/501 |
| 5,625,883 A * | 4/1997 | Leyten et al. ............... 455/41.1 |
| 5,629,838 A | 5/1997 | Knight et al. ................ 361/782 |
| 5,818,984 A * | 10/1998 | Ahmad et al. .................. 385/14 |
| 5,848,214 A * | 12/1998 | Haas et al. ................... 385/120 |
| 5,857,042 A * | 1/1999 | Robertson et al. ............. 385/33 |
| 6,049,639 A * | 4/2000 | Paniccia et al. ................ 385/14 |
| 6,090,636 A * | 7/2000 | Geusic et al. .................. 438/31 |
| 6,229,158 B1 * | 5/2001 | Minemier et al. ............. 257/81 |
| 6,452,705 B1 * | 9/2002 | Paxton ........................ 398/131 |
| 6,728,113 B1 | 4/2004 | Knight et al. ................ 361/760 |
| 6,752,539 B2 * | 6/2004 | Colgan et al. .................. 385/92 |
| 6,916,719 B1 | 7/2005 | Knight et al. ................ 438/381 |
| 6,924,510 B2 * | 8/2005 | Gardner et al. ................. 257/79 |
| 7,112,980 B2 * | 9/2006 | Neaves et al. ................ 324/765 |
| 7,212,638 B2 * | 5/2007 | Kurdziel et al. ............. 380/273 |
| 7,369,726 B2 * | 5/2008 | Drost et al. .................... 385/42 |
| 2003/0039455 A1 * | 2/2003 | Ouchi .......................... 385/88 |
| 2004/0018654 A1 * | 1/2004 | Drost et al. .................... 438/17 |
| 2005/0285214 A1 * | 12/2005 | Krishnamoorthy et al. .. 257/414 |
| 2006/0013595 A1 * | 1/2006 | Trezza et al. ................. 398/164 |

* cited by examiner

*Primary Examiner*—Hanh Phan
(74) *Attorney, Agent, or Firm*—Park, Vaughan & Fleming LLP

(57) ABSTRACT

A system that facilitates high-speed data transfer between integrated circuit chips. The system contains a first integrated circuit chip, which includes a capacitive receiver and an electrical-to-optical transceiver. The capacitive receiver receives a capacitively coupled voltage signal transmitted from a corresponding capacitive transmitter located on a second integrated circuit chip and converts the capacitively coupled voltage signal into an electrical signal. The electrical-to-optical transceiver converts the electrical signal to an optical signal and transmits the optical signal to an optical device through optical coupling.

21 Claims, 3 Drawing Sheets

INTEGRATED PROXIMITY-TO-OPTICAL TRANSCEIVER CHIP

RELATED APPLICATION

This application is a continuation-in-part of a U.S. patent application, entitled "Optical Communication Between Face-to-Face Semiconductor Chips," by inventor Robert J. Drost and William S. Coates, having Ser. No. 10/816,762 and a filing date of 2 Apr. 2004 now U.S. Pat. No. 7,369,726. This application hereby claims priority under 35 U.S.C. §120 to the above-listed patent application. Moreover, the above-listed application is hereby incorporated by reference. This application also hereby claims priority under 35 U.S.C. §119 to U.S. Provisional Patent Application No. 60/583,941 filed 28 Jun. 2004, entitled "Integrated Proximity-to-Optical Transceiver Chip," by inventors Ashok V. Krishnamoorthy, Danny Cohen, and Robert J. Drost.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for communicating between integrated circuit chips. More specifically, the present invention relates to an electrical-to-optical and optical-to-electrical transceiver chip to facilitate high-speed signaling between integrated circuit chips using optical coupling.

2. Related Art

Advances in semiconductor technology presently make it possible to integrate large-scale systems, including tens of millions of transistors, onto a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

However, these semiconductor chips still need to communicate with other chips, and unfortunately, these advances in semiconductor technology have not been matched by corresponding advances in inter-chip communication technology. Semiconductor chips, are typically integrated into a printed circuit board which contains multiple layers of signal lines for inter-chip communication. However, a semiconductor chip typically contains about 100 times to 1000 times more signal lines than a printed circuit board. Consequently, only a tiny fraction of the signal lines on a semiconductor chip can be routed across the printed circuit board to other chips. This problem is creating a bottleneck that is expected to worsen as semiconductor integration densities continue to increase.

To overcome this communication bottleneck, researchers have recently developed an alternative technique, known as "Proximity Communication," to communicate between semiconductor chips. Proximity Communication can be implemented by integrating arrays of capacitive transmitters and receivers onto active surfaces of integrated circuit (IC) chips to facilitate inter-chip communication. If a first chip is situated face-to-face with a second chip so that transmitter regions on the first chip are capacitively coupled with receiver regions on the second chip, it is possible to transmit signals directly from the first chip to the second chip without having to route the signal through intervening signal lines within a printed circuit board. The advantage of such an arrangement is that a large number electronic terminals on one chip can each communicate with corresponding electronic terminals on the other chip.

Proximity Communication makes it possible to communicate with an extremely large bandwidth per unit area. For example, the size and center-to-center pitch of Proximity Communication terminals, in an exemplary implementation, can be 20 microns and 30 microns, respectively. Moreover, under Proximity Communication, signals travel in the direction normal to the surface of the chip. Therefore, Proximity Communication allows communication to take place across a fully populated two-dimensional array of terminals, with many rows and many columns.

For comparison purposes, the size and pitch of a typical wire bond terminal may be 100 microns on a side with a pitch of 150 microns from the center of one terminal to the neighboring terminal. Furthermore, wire bonds are typically limited to a few rows. Hence, wire bonds generally cannot be used to provide a large fully populated two-dimensional array of terminals. Also, wire bonds are permanent, and do not permit rematabilty of connectors. (Note that term "rematability" refers to the ability to connect, disconnect, and reconnect terminals under field conditions.)

A significant limitation for conventional electrical interconnects is that they are designed either for moderate density (e.g. wire-bonds, or BGA) or for remateability (i.e. connectors), but not simultaneously for both. For instance, multiple solutions exist for remateable connections at the printed circuit board level. However, these connections have low-density and support only moderate bandwidth per connection. A high-density or even a moderate density connector that may be detachably connected to an individual IC chip does not exist.

Even if the problem of transporting data across chip boundaries at high bandwidth can be solved, the data must then be transported between chips at high bandwidth. This can be accomplished through optical communication techniques. Optical communication techniques have played a vital role in global, inter-state, metro, campus, intra-building, and central-office applications. However, to be of high utility within computer systems (i.e. "inside the box"), major improvements in I/O bandwidth-density are needed.

Optical interconnects have had significant penetration in board-to-board, rack-to-rack, and box-to-box interconnect applications. In these applications, optical transceivers with an aggregate capacity of 10 gigabits per second to 40 gigabits per second are the state of the art today. Typically, each transceiver provides 1, 4, or 12 separate channels arranged in one-dimensional 1×12 arrays. Optical transceivers based on two-dimensional arrays of optical lasers and optical detectors can potentially provide bandwidth in excess of 100 Gigabit per second.

For the foreseeable future, electrical ICs will be responsible for processing information. Therefore, any optically interconnected system will involve electrical-to-optical and optical-to-electrical conversion operations.

These conversion operations presently cause a number of electrical bottlenecks. The first electrical bottleneck appears between the optoelectronic driver and receiver circuits, and the photonic devices themselves. This bottleneck can be mitigated by integrating photonics onto IC chips and by creating optical modulators in silicon A second electrical bottleneck appears in the data transport from the rest of the system (processors, memory, switching, control, etc) to the input of the optical transceiver. This bottleneck is more difficult to solve, due to a lack of very high-speed bus standards among processor vendors, and because there is no credible thermal or packaging solution that allows high-density optical technology to be combined with silicon processors. Furthermore, there are currently no accepted electrical interconnect solutions for aggregate off-chip bandwidth beyond 1-2 Tbps. Note that conventional technologies, such as wire-bonding, cannot scale to this bandwidth capacity.

Therefore, there is presently a need for improved communication techniques to provide additional bandwidth between electrical components and optical interconnects.

SUMMARY

One embodiment of the present invention provides a system that facilitates high-speed data transfer between integrated circuit chips. The system contains a first integrated circuit chip, which includes a capacitive receiver and an electrical-to-optical transceiver. The capacitive receiver receives a capacitively coupled voltage signal transmitted from a corresponding capacitive transmitter located on a second integrated circuit chip and converts the capacitively coupled voltage signal into an electrical signal. The electrical-to-optical transceiver converts the electrical signal to an optical signal and transmits the optical signal to an optical device through optical coupling.

In a variation on this embodiment, the first integrated circuit chip additionally supports bi-directional communication by providing an optical-to-electrical transceiver and a capacitive transmitter. The optical-to-electrical transceiver receives a second optical signal transmitted from the optical device through optical coupling and converts the second optical signal into a second electrical signal. The capacitive transmitter converts the second electrical signal into a second capacitively coupled voltage signal and transmits the second capacitively coupled voltage signal to a corresponding capacitive receiver located on the second integrated circuit chip.

In a further variation, the optical device is an optical connector which includes an optical receiver and an optical transmitter, which communicate with the optical-to-electrical transceiver in the first integrated circuit chip through optical coupling In a variation on this embodiment, the first integrated circuit chip is not permanently attached to the optical receiver in the optical connector, whereby the first integrated circuit chip can be easily remated to other optical connectors and to other integrated circuit chips.

In a variation on this embodiment, the optical device is a third integrated circuit chip, which is optically coupled to the first integrated circuit chip. The third integrated circuit chip includes an optical-to-electrical transceiver which receives the optical signal transmitted by the electrical-to-optical transceiver on the first integrated circuit chip through optical coupling and converts the optical signal to an electrical signal.

In a variation on this embodiment, the third integrated circuit chip supports bi-directional communication by providing an electrical-to-optical transceiver which converts a third electrical signal to a third optical signal and transmits the third optical signal to the optical-to-electrical transceiver located on the first integrated circuit chip through optical coupling.

In a variation on this embodiment, the third integrated circuit chip includes an on-chip optical waveguide.

In a variation on this embodiment, the electrical-to-optical transceiver in the third integrated circuit chip is not permanently attached to the optical-to-electrical transceiver in the first integrated circuit chip, and the optical-to-electrical transceiver in the third integrated circuit chip is not permanently attached to the electrical-to-optical transceiver in the first integrated circuit chip, whereby the first integrated circuit chip can be easily remated to other integrated circuit chips.

In a variation on this embodiment, the first integrated circuit chip includes functional blocks that generate the electrical signals to be converted to optical signals for transmission to an optical device.

In a variation on this embodiment, the first integrated circuit chip includes a multiplexing mechanism, which facilitates transferring data at high aggregate bandwidths.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Proximity-to-Optical Transceiver (IPOT) Chip

The present invention uses Proximity Communication techniques to provide a high-density, remateable connector that connects directly to and disconnects directly from high-speed electrical connections on the surface of an integrated optical transceiver chip. In one embodiment of the present invention, the highly scalable Integrated Proximity-to-Optical Transceiver (IPOT) chip contains remateable electrical Proximity communications circuitry and additional circuitry to convert Proximity communications signals into signals suitable for driving optical devices, such as an integrated optical device, and a remateable optical free-space interface, a waveguide interface, or a fiber interface.

Figure 1A:
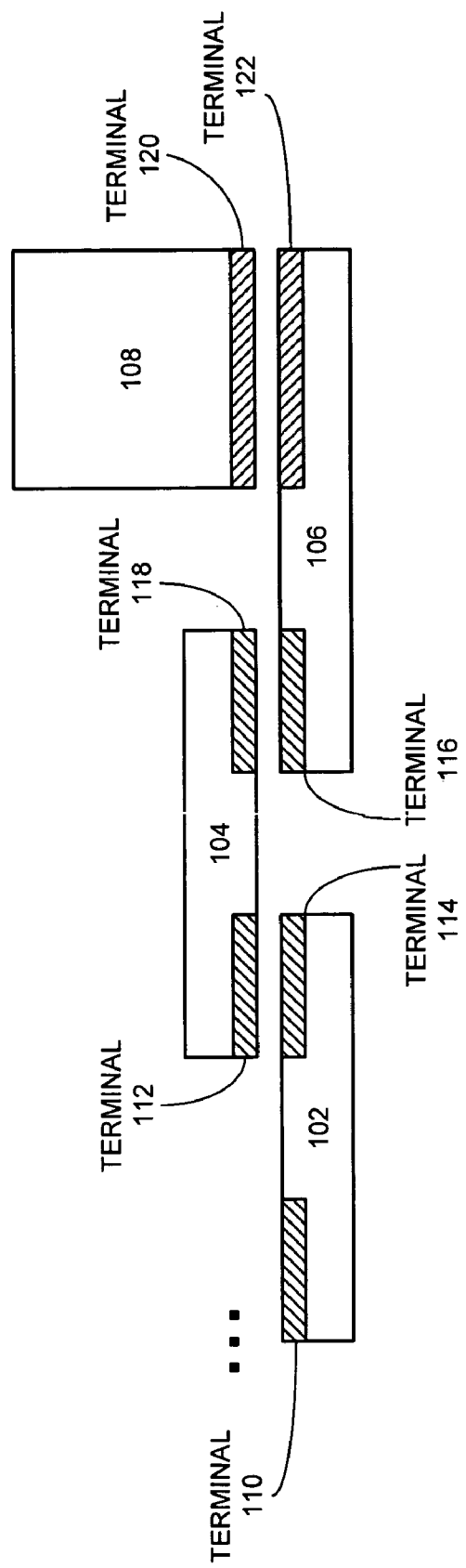
FIG. 1A illustrates an integrated circuit chip optically coupled to an optical connector in accordance with an embodiment of the present invention.

FIG. 1A illustrates an integrated circuit chip optically coupled to an optical connector in accordance with an embodiment of the present invention. It contains integrated circuit chips 102, 104, and 106, optical connector 108, capacitively coupled terminals 110, 112, 114, 116, and 118, and optically coupled terminals 120 and 122. Note that integrated circuit chip 106 is the IPOT chip. In one embodiment of the present invention, the IPOT chip includes a remateable Proximity connector. In another embodiment of the present invention, the IPOT chip includes a remateable optical connector.

Integrated circuit 106 receives capacitively coupled voltage signals at a capacitive receiver transmitted from other Proximity Communication-enabled ICs and converts these capacitively coupled voltage signals into electrical signals. It then converts the electrical signals to optical signals using an electrical-to-optical transceiver and transmits these optical signals to an optical receiver located in optical connector 108. Similarly, integrated circuit 106 can receive optical signals from the optical transmitter located in optical connector 108. It then converts these optical signals to electrical signals using an optical-to-electrical transceiver. Next, it converts these electrical signals into capacitively coupled voltage signals using a capacitive transmitter and transmits them to other integrated circuits using capacitive coupling.

In one embodiment of the present invention, the optical connector can include: a free-space optical connector, a lensed connector, a fiber or fiber-array connector, or another form of integrated optical waveguide.

Figure 1B:
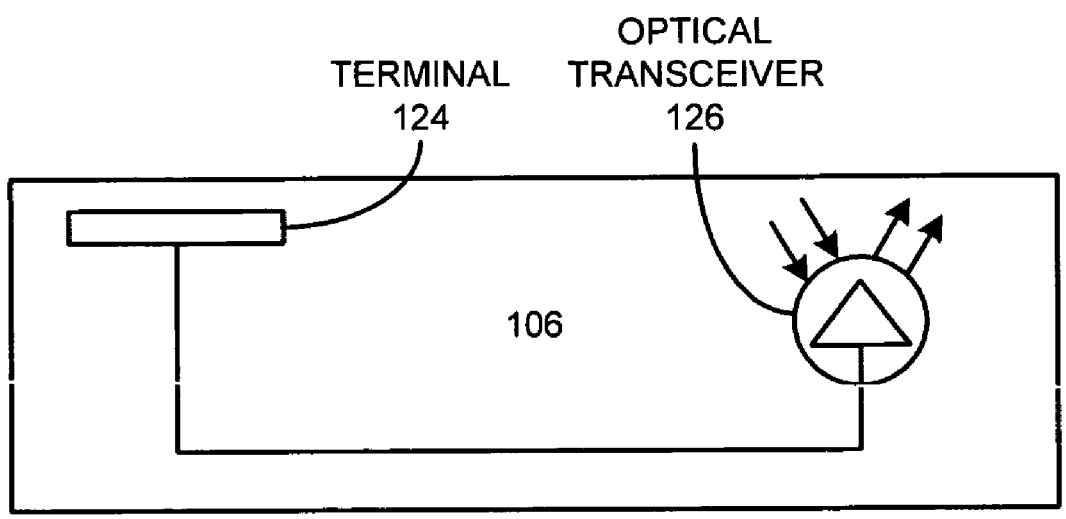
FIG. 1B presents a circuit diagram for the Integrated Proximity-to-Optical Transceiver chip in accordance with an embodiment of the present invention.

FIG. 1B presents a circuit diagram for the Integrated Proximity-to-Optical Transceiver chip in accordance with an embodiment of the present invention. It contains integrated circuit 106, capacitive terminal 124, and optical transceiver 126.

In one embodiment of the present invention, integrated circuit 106 receives a capacitively coupled voltage signal and converts the capacitively coupled voltage signal to an electrical signal at capacitive terminal 124. Integrated circuit 106 then converts the electrical signal to an optical signal using an electrical-to-optical mechanism within optical transceiver 126 and transmits the optical signal.

In one embodiment of the present invention, integrated circuit 106 receives an optical signal at optical transceiver 126 and converts the optical signal to an electrical signal using an optical-to-electrical mechanism within optical transceiver 126. Integrated circuit 106 then converts the electrical signal to a capacitively coupled voltage signal and transmits the capacitively coupled voltage signal using capacitive terminal 124.

Figure 2:
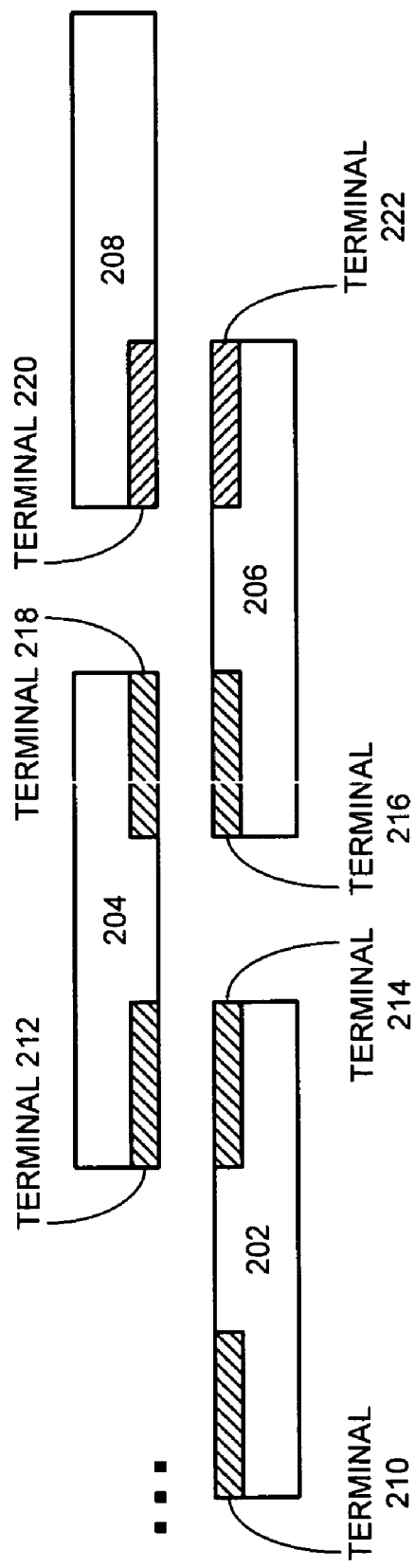
FIG. 2 illustrates an integrated circuit chip optically coupled to an integrated circuit chip with an optical-to-electrical transceiver and an electrical-to-optical transceiver in accordance with an embodiment of the present invention.

FIG. 2 illustrates an integrated circuit chip optically coupled to an integrated circuit chip with an optical-to-electrical transceiver and an electrical-to-optical transceiver in accordance with an embodiment of the present invention. It contains integrated circuit chips 202, 204, 206, and 208, capacitively coupled terminals 210, 212, 214, 216, and 218, and optically coupled terminals 220 and 222. Note that integrated circuit 206 is the IPOT chip. In one embodiment of the present invention, integrated circuit 208 includes on-chip optical waveguides.

Integrated circuit 206 and integrated circuit 208 communicate through optical coupling. This chip-to-chip optical coupling is referred to as an "optical proximity" connection. In one embodiment of the present invention, the optical terminals located on integrated circuit chips 206 and 208 are remateable.

Integrated circuit 206 receives capacitively coupled voltage signals at a capacitive receiver transmitted from other Proximity Communication-enabled ICs and converts these capacitively coupled voltage signals into electrical signals. It then converts the electrical signals to optical signals using an electrical-to-optical transceiver and transmits these optical signals to an optical-to-electrical transceiver located on integrated circuit 208. Similarly, integrated circuit 206 can receive optical signals from the electrical-to-optical transceiver located on integrated circuit 208. It then converts these optical signals to electrical signals using an optical-to-electrical transceiver. Next, it converts these electrical signals into capacitively coupled voltage signals using a capacitive transmitter and transmits them to other integrated circuits using capacitive coupling.

In one embodiment of the present invention, integrated circuit 206 does not contain capacitively coupled terminal 216, but instead contains a permanently attached conductive connection for electrical signaling. Integrated circuit 208 includes on-chip optical waveguides which transmit optical signals to integrated circuit 206 through optical coupling. Note that the optical coupling between integrated circuit 206 and integrated circuit 208 is referred to as "Optical Proximity Communication." Note that the optical connectors on integrated circuits 206 and 208 are not permanently attached to each other and can be easily remated to other optical connectors or optical devices.

Different physical optical-to-electrical component integration schemes for the integrated proximity-to-optical transceiver chip exist. In one embodiment of the present invention, flip-chip integration is used. In another embodiment of the present invention, silicon-based modulators fabricated on silicon-on-insulator wafers are used. In yet another embodiment of the present invention, a technique for monolithic integration of optical modulators on a silicon and nano-photonics techniques for confining and guiding light in fully VLSI-compatible silicon-based platform is used to marry photonics with VLSI electronics.

Transmission Techniques

Different configurations of the high-capacity electrical and optical I/O for the IPOT chip exist. For instance, there is a wide range of optical transmission approaches to transfer data at high aggregate bandwidths between electronic chips. In one embodiment of the present invention, techniques for data multiplexing include the use of time, frequency, spatial multiplexing via parallel arrays, and multiplexing in the fiber domain.

In one embodiment of the present invention, each multiplexing approach involves combinations of electrical and optical multiplexing. The electronic multiplexing techniques include time division multiplexing (TDM) and sub-carrier multiplexing (SCM). The optical multiplexing techniques include optical time division multiplexing (OTDM), dense wavelength division multiplexing (DWDM) and coarse wavelength division multiplexing (CWDM). In one embodiment of the present invention, spatial multiplexing is used where parallel fibers carry signals from single channels to multiplexed channels.

Electrical TDM: Electrical TDM is a technique of interleaving N data channels running at a bit rate B into a single higher bit rate stream running at a data rate NB. Traditional electronic multiplexing and demultiplexing techniques are widely used today. Data is encoded onto an optical link and after it is received, it is converted back to an electronic signal and processed by the receiver electronics.

SCM: Sub-carrier Multiplexing is a technique of modulating a digital signal onto an RF sinusoidal tone used as a carrier. Different types of modulation formats exist. For instance, simple double sideband amplitude modulation (DS-BAM), single sideband amplitude modulation (SSB-AM) and suppressed-carrier double and single-sideband (SC-DSB and SC-SSB) are examples. These choices are often made for reasons of spectral efficiency and robustness against transmission impairments. The RF modulated signal is then used to drive an optical transmitter and the RF carrier is a subcarrier of the optical signal. Multiple RF sub-carriers may be combined onto a single optical channel for data multiplexing and transmission.

Optical TDM: Optical time division multiplexing (OTDM) is similar to electrical TDM in that lower bit rate channels are interleaved to a higher bit rate to transmit N channels at the increased bit rate NB in the same time duration as a single bit for one original channel. However, with OTDM, the lower speed data is impressed onto low duty cycle optical clock pulses that are then interleaved with other data streams to high bit rates using passive optics. The principle is called the "split and interleave" technique. An ultra-fast optical pulse source generates pulses whose width are equal to the final bit rate but spaced apart at the pre-multiplexed data sub-rate for channels $D1(t)$ to $DN(t)$. The optical pulse train is split into N copies using a passive power splitter and optionally an optical amplifier. Each copy of the pulse train is modulated by a different sub-rate data stream, and delayed by incremental amount before being passively combined to realize the final OTDM output.

Dense WDM: Dense WDM (DWDM) is typically achieved by modulating data directly onto highly stable optical carriers, then combining these carriers into the fiber. In one embodiment of the present invention the IPOT uses low-voltage modulators to modulate multiple wavelengths in parallel, and uses wavelength division multiplexed fiber transport. The advantage of such a configuration is that the spatial density of the IPOT-chip is improved by reducing the number of fibers that must be connected to the chip.

Coarse WDM: Course WDM (CWDM) was designed for lower cost applications where the wavelength channels are spaced further apart. In this case, larger source line widths can be used and larger temperature-dependent wavelength drifts can be tolerated.

Spatial Multiplexing: Spatial multiplexing refers to using an individual fiber connected to an individual optical source with multiple (parallel) fibers from the transmitter to the receiver. In this model there can be electrical multiplexing up to the optical source and a subset of all optical sources can be combined via WDM onto each fiber with multiple fibers utilized. One example of spatial multiplexing, where electrical multiplexing is used without optical multiplexing, is the use a vertical cavity surface emitting laser (VCSEL) array coupled to a fiber array with one fiber per VCSEL. An equivalent receiver array is then required at the receiving end of the link.

PDM and PI: Polarization Division Multiplexing (PDM) and Polarization Interleaving (PI) can be used to send multiple orthogonally polarized channels in a fiber. With this technique, multiple channels are transmitted in parallel over different polarization states.

Different combinations of these multiplexing approaches can be used to achieve the target capacity. Each configuration may have unique advantages for the given application. For example 2.5 Gbps channel data rates can initially be multiplexed using traditional TDM domain to 40 Gbps, and further multiplexed to greater than 100 Gbps using OTDM, and finally to 1 Tbps by wavelength multiplexing several such channels using DWDM or CWDM. An alternative path to a 1 Tbps target capacity could be to multiplex 1 Gbps TDM channels to a moderate number of SCM channels (e.g. 32) and then utilize either SCM onto parallel fibers or DWDM multiplexing to achieve 1 Tbps. Other IPOT configurations exist. For each configuration, an IPOT chip with integrated on-chip optical and/or electrical multiplexing mechanism is used.

Integrated Proximity-to-Optical Transceiver Advantages

There are many advantages of the proposed IPOT chip. Remateable Proximity communication removes electrical bottlenecks in optical transceivers. As discussed earlier, this represents an important breakthrough for optical transceivers. It will further enable joining diverse opto-electronic technologies on a common base. Additionally, the communication latency between high-performance chips or modules interconnected with IPOT chips can be significantly reduced by eliminating multiple chip and package delays. Note that latency is a source of performance bottlenecks in current systems. The above benefits can have an avalanche of positive benefits. For instance, a 10× density improvement enables chips to become more compact, squeezing more computational power in smaller area and thereby further reduce latency.

Some of the system-level advantages of Integrated Proximity-to-Optical Transceiver IPOT are summarized below:
1. Seamless, scalable electrical-to-optical communication capacity;
2. IPOT array footprint (density) is best-in-class for optical transceivers;
3. Low power consumption for electrical signaling;
4. Low cost if using space multiplexing with VCSELs;
5. Scalable increases in channel count and capacity without increased number of fiber if using WDM or SCM;
6. Spatial channel density with WDM or SCM is not limited by fiber connector density;
7. Reduction in fiber congestion and routing versus discrete non-integrated solutions;
8. No fundamental bottlenecks for higher channel data rates (above 20 GHz);
9. Channel sparing for transmitter easy with WDM or SCM;
10. Direct attachment to electrical chips (proximity) and to optical fiber (butt-coupling);
11. Reduced fiber-connector size and simplified packaging for remateable optics;
12. Possibility for more secure communication via WDM;
13. Less eavesdropping and electromagnetic interference due to fewer wire bonds and reduced off-chip electrical bandwidth; and
14. Portability.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that facilitates high-speed data transfer between integrated circuit chips, comprising:
   a first integrated circuit chip, wherein the first integrated circuit chip includes:
   a remateable capacitive receiver which receives a capacitively coupled voltage signal transmitted from a corresponding capacitive transmitter located on a second integrated circuit chip and converts the capacitively coupled voltage signal into an electrical signal;
   an electrical-to-optical transceiver which converts the electrical signal to an optical signal and transmits the optical signal to an optical device through remateable optical coupling;
   an optical-to-electrical transceiver which receives a second optical signal transmitted from the optical device through optical coupling and converts the second optical signal to a second electrical signal; and a capacitive transmitter which converts the second electrical signal into a second capacitively coupled voltage signal and transmits the second capacitively coupled voltage signal to a corresponding capacitive receiver located on a second integrated circuit chip.

2. The apparatus of claim 1, wherein the optical device is:
an optical connector which includes an optical receiver and an optical transmitter;
wherein the optical transmitter transmits an optical signal to the optical-to-electrical transceiver in the first integrated circuit chip through optical coupling; and
wherein the optical receiver receives an optical signal transmitted from the electrical-to-optical transceiver in the first integrated circuit chip through optical coupling.

3. The apparatus of claim 2, wherein the electrical-to-optical transceiver in the first integrated circuit chip is not permanently attached to the optical receiver in the optical connector, and the optical-to-electrical transceiver in the first integrated circuit chip is not permanently attached to the optical transmitter in the optical connector, whereby the first integrated circuit chip can be easily remated to other optical connectors and to other integrated circuit chips.

4. The apparatus of claim 1, wherein the optical device is a third integrated circuit chip;
wherein the third integrated circuit chip is optically coupled to the first integrated circuit chip; and
wherein the third integrated circuit chip includes:
an optical-to-electrical transceiver which receives the optical signal transmitted by the electrical-to-optical transceiver located on the first integrated circuit chip through optical coupling and converts the optical signal to an electrical signal.

5. The apparatus of claim 4, wherein the third integrated circuit chip supports bi-directional communication and additionally includes:
an electrical-to-optical transceiver which converts a third electrical signal to a third optical signal and transmits the third optical signal to the optical-to-electrical transceiver located on the first integrated circuit chip through optical coupling.

6. The apparatus of claim 5, wherein the third integrated circuit chip includes an on-chip optical waveguide.

7. The apparatus of claim 5, wherein the electrical-to-optical transceiver in the third integrated circuit chip is not permanently attached to the optical-to-electrical transceiver in the first integrated circuit chip, and the optical-to-electrical transceiver in the third integrated circuit chip is not permanently attached to the electrical-to-optical transceiver in the first integrated circuit chip, whereby the first integrated circuit chip can be easily remated to other integrated circuit chips.

8. The apparatus of claim 1, wherein the first integrated circuit chip includes functional blocks that generate the electrical signals to be converted to optical signals for transmission to an optical device.

9. The apparatus of claim 1, wherein the first integrated circuit chip includes a multiplexing mechanism, which facilitates transferring data at high aggregate bandwidths.

10. A method that facilitates high-speed data transfer between integrated circuit chips, comprising:
receiving a capacitively coupled voltage signal at a remateable capacitive receiver located on a first integrated circuit chip transmitted from a corresponding capacitive transmitter located on a second integrated circuit chip;
converting the capacitively coupled voltage signal into an electrical signal;
converting the electrical signal to an optical signal using an electrical-to-optical transceiver located on the first integrated circuit chip and transmitting the optical signal to an optical device through remateable optical coupling;
receiving a second optical signal at an optical-to-electrical transceiver located on the first integrated circuit, wherein the second optical signal is transmitted from the optical device through optical coupling;
converting the second optical signal into second electrical signal;
converting the second electrical signal into a second capacitively coupled voltage signal using a capacitive transmitter located on the first integrated circuit chip; and
transmitting the second capacitively coupled voltage signal to a corresponding capacitive receiver located on a second integrated circuit.

11. The method of claim 10,
wherein the optical device is an optical connector which includes an optical receiver and an optical transmitter;
wherein the optical transmitter in the optical connector transmits an optical signal to the optical-to-electrical transceiver in the first integrated circuit chip through optical coupling; and
wherein the optical receiver in the optical connector receives an optical signal transmitted from the electrical-to-optical transceiver in the first integrated circuit chip through optical coupling.

12. The method of claim 11, wherein the electrical-to-optical transceiver in the first integrated circuit chip is not permanently attached to the optical receiver in the optical connector, and the optical-to-electrical transceiver in the first integrated circuit chip is not permanently attached to the optical transmitter in the optical connector, whereby the first integrated circuit chip can be easily remated to other integrated circuit chips and to other optical connectors.

13. The method of claim 10,
wherein the optical device is a third integrated circuit chip to the first integrated circuit chip; and
wherein the method further involves:
receiving the optical signal at an optical-to-electrical transceiver located on the third integrated circuit chip transmitted by the electrical-to-optical transceiver located on the first integrated circuit chip through optical coupling; and
converting the optical signal to an electrical signal.

14. The method of claim 13, wherein the method additionally involves:
converting a third electrical signal to a third optical signal using an electrical-to-optical transceiver located on the third integrated circuit chip; and
transmitting the third optical signal to the optical-to-electrical transceiver located on the first integrated circuit chip through optical coupling.

15. The method of claim 14, wherein the third integrated circuit chip includes an on-chip optical waveguide.

16. The method of claim 14, wherein the electrical-to-optical transceiver in the third integrated circuit chip is not permanently attached to the optical-to-electrical transceiver in the first integrated circuit chip, and the optical-to-electrical transceiver in the third integrated circuit chip is not permanently attached to the electrical-to-optical transceiver in the first integrated circuit chip, whereby the first integrated circuit chip can be easily remated to other integrated circuit chips.

17. The method of claim 10, wherein the first integrated circuit chip includes functional blocks that generate the electrical signals to be converted to optical signals for transmission to an optical device.

18. The method of claim 10, wherein the first integrated circuit chip includes a multiplexing mechanism, which facilitates transferring data at high aggregate bandwidths.

19. A computer system that facilitates high-speed data transfer between integrated circuit chips, comprising:
- a processor;
- a memory; and
- a first integrated circuit chip, wherein the first integrated circuit chip includes:
  - a remateable capacitive receiver which receives a capacitively coupled voltage signal transmitted from a corresponding capacitive transmitter located on a second integrated circuit chip and converts the capacitively coupled voltage signal into an electrical signal;
  - an electrical-to-optical transceiver which converts the electrical signal to an optical signal and transmits the optical signal to an optical device through remateable optical coupling;
  - an optical-to-electrical transceiver which receives a second optical signal transmitted from the optical device through optical coupling and converts the second optical signal to a second electrical signal; and
  - a capacitive transmitter which converts the second electrical signal into a second capacitively coupled voltage signal and transmits the second capacitively coupled voltage signal to a corresponding capacitive receiver located on a second integrated circuit chip.

20. An apparatus that facilitates high-speed data transfer between integrated circuit chips, comprising:
- a first integrated circuit chip, wherein the first integrated circuit chip includes an electrical-to-optical transceiver which converts an electrical signal to an optical signal;
- a second integrated circuit chip that receives the optical signal from the first integrated circuit chip, wherein the second integrated circuit chip includes an remateable optical waveguide for transferring the optical signal across the second integrated circuit chip;
- an optical-to-electrical transceiver which receives a second optical signal transmitted from the optical waveguide located on the second integrated circuit chip and converts the second optical signal to a second electrical signal; and
- a capacitive transmitter which converts the second electrical signal into a capacitively coupled voltage signal and transmits the capacitively coupled voltage signal to a corresponding capacitive receiver located on an integrated circuit chip.

21. The apparatus of claim 20, wherein the electrical-to-optical transceiver in the first integrated circuit chip is not permanently attached to the optical waveguide on the second integrated circuit chip, and the optical-to-electrical transceiver in the first integrated circuit chip is not permanently attached to the optical waveguide on the second integrated circuit chip, whereby the first integrated circuit chip can be easily remated to other integrated circuit chips.

* * * * *